US012660688B2

(12) United States Patent
Bailey

(10) Patent No.: US 12,660,688 B2
(45) Date of Patent: Jun. 16, 2026

(54) FLEXIBLE LED DISPLAY HAVING AN OPTIC OPTICALLY COUPLED WITH AN LED CHIP

(71) Applicant: Autosystems, Aurora, CA (US)

(72) Inventor: Edward Bailey, Rochester Hills, MI (US)

(73) Assignee: AUTOSYSTEMS, A DIVISION OF MAGNA EXTERIORS INC., Aurora (CA)

( * ) Notice: Subject to any disclaimer, the term of this patent is extended or adjusted under 35 U.S.C. 154(b) by 775 days.

(21) Appl. No.: 17/891,732

(22) Filed: Aug. 19, 2022

(65) Prior Publication Data

US 2023/0056752 A1 Feb. 23, 2023

Related U.S. Application Data

(60) Provisional application No. 63/235,134, filed on Aug. 19, 2021.

(51) Int. Cl.
| | |
|---|---|
| *H10W 90/00* | (2026.01) |
| *B60K 35/22* | (2024.01) |
| *H10H 20/01* | (2025.01) |
| *H10H 20/855* | (2025.01) |
| *H10H 20/857* | (2025.01) |

(52) U.S. Cl.
CPC ........... *H10W 90/00* (2026.01); *B60K 35/223* (2024.01); *H10H 20/01* (2025.01); *H10H 20/855* (2025.01); *H10H 20/857* (2025.01); *H10H 20/0363* (2025.01); *H10H 20/0364* (2025.01)

(58) Field of Classification Search
CPC ..... H10W 90/00; B60K 35/223; B60K 35/00;
H10H 20/01; H10H 20/855; H10H 20/857; H10H 20/0363; H10H 20/0364; H10H 20/853; H10H 20/856; H01L 25/0753
See application file for complete search history.

(56) References Cited

U.S. PATENT DOCUMENTS

| | | | | |
|---|---|---|---|---|
| 8,546,842 B2 * | 10/2013 | Higuma | ............. | H10H 20/8581 |
| | | | | 438/126 |
| 9,000,466 B1 | 4/2015 | Aldaz | | |
| 9,246,311 B1 | 1/2016 | Raring et al. | | |
| 9,520,695 B2 | 12/2016 | Hsu et al. | | |
| 10,575,374 B2 * | 2/2020 | Yan | ..................... | H01L 25/0753 |
| 11,150,590 B2 * | 10/2021 | Matsuo | ............. | G03G 15/6597 |

(Continued)

OTHER PUBLICATIONS

Kelly-Detwiler, "LEDs Will Get Even More Efficient: Cree Passes 300 Lumens Per Watt", 2014, https://www.forbes.com/sites/peterdetwiler/2014/03/27/leds-will-get-even-more-efficient-cree-passes-300-lumens-per-watt/?sh=1d9e89626118, retrieved on Jan. 6, 2023, 3 pages.

(Continued)

*Primary Examiner* — Tan N Tran
(74) *Attorney, Agent, or Firm* — Dority & Manning, P.A.

(57) ABSTRACT

An LED display includes an LED chip configured to emit light about a focal axis. A circuit board is configured to selectively electrify the LED chip. The circuit board is elastically deformable. An optic is optically coupled with the LED chip and defines an optical axis. The optic is elastically deformable. The optical axis and the focal axis maintain a generally aligned position when the circuit board is positioned in a non-planar orientation.

10 Claims, 16 Drawing Sheets

(56) References Cited

U.S. PATENT DOCUMENTS

| | | | |
|---|---|---|---|
| 11,757,068 B2* | 9/2023 | Han | G02B 5/0205 |
| | | | 257/88 |
| 2012/0007102 A1 | 1/2012 | Feezell et al. | |
| 2012/0112220 A1 | 5/2012 | West et al. | |
| 2014/0175492 A1 | 6/2014 | Steranka et al. | |
| 2016/0190408 A1 | 6/2016 | Kamada | |
| 2016/0315068 A1 | 10/2016 | Lee et al. | |
| 2017/0345974 A1 | 11/2017 | Yamada et al. | |
| 2018/0149321 A1 | 5/2018 | Torvinen | |
| 2021/0193881 A1 | 6/2021 | Imada et al. | |

OTHER PUBLICATIONS

Hurni, et al, "Bulk GaN Flip-chip Violet Light-Emitting Diodes with Optimized Efficiency for High-Power Operation", Applied Physics Letters, vol. 106, 2015, 5 pages.
International Search Report Corresponding with Application No. PCT/US2022/040903 on Dec. 2, 2022 (1 page).

* cited by examiner

2002

2003

2000

2001

| flexible LED PCB material stack | Thickness (mm) | Element |
|---|---|---|
| silicone | 0.15 | 3001 |
| solder mask | 0.025 | 3002 |
| LED flip chip on sapphire | 0.09 | 3003 |
| solder high reliability | 0.025 | 3004 |
| ImAu plating | 0.0008 | 3005 |
| EN plating | 0.0026 | 3006 |
| 1/3 - 1oz Cu | 0.0175 | 3007 |
| Polyimide | 0.05 | 3008 |
| Aluminum/Silicon alloy 4032 | 0.6 | 3009 |

| flexible LED PCB material stack | Thickness (mm) | Element |
|---|---|---|
| silicone | 0.15 | 4001 |
| solder mask | 0.025 | 4002 |
| LED flip chip on sapphire | 0.09 | 4003 |
| solder high reliability | 0.025 | 4004 |
| ImAu plating | 0.0008 | 4005 |
| EN plating | 0.0026 | 4006 |
| 1/3 - 1oz Cu | 0.0175 | 4007 |
| Ceramic filled FR4/CEM3 | 0.2 | 4008 |
| 1/3 - 1oz Cu | 0.0175 | 4009 |
| solder mask | 0.025 | 4010 |

| Area | Value | Rule | Minimum | Maximum | Margin |
|---|---|---|---|---|---|
| Max | 212.335 cd | Max (passed) | | 300 [300] | 29.2% |
| Visibility | 1.371636 cd | Visibility (passed) | 0.3 [0.3] | | 357.1% |
| 5L-10U | 91.9285 cd | 5L-10U_Min (passed) | 16 [16] | | 474.6% |
| 5R-10U | 146.63 cd | 5R-10U_Min (passed) | 16 [16] | | 816.4% |
| 20L-5U | 27.7702 cd | 20L-5U_Min (passed) | 10 [10] | | 177.7% |
| 10L-5U | 73.8938 cd | 10L-5U_Min (passed) | 30 [30] | | 146.3% |
| V-5U | 139.543 cd | V-5U_Min (passed) | 70 [70] | | 99.3% |
| 10R-5U | 195.517 cd | 10R-5U_Min (passed) | 30 [30] | | 551.7% |
| 20R-5U | 177.517 cd | 20R-5U_Min (passed) | 10 [10] | | 1675.2% |
| 10L-H | 76.3302 cd | 10L-H_Min (passed) | 40 [40] | | 90.8% |
| 5L-H | 109.817 cd | 5L-H_Min (passed) | 80 [80] | | 37.3% |
| V-H | 145.09 cd | V-H_Min (passed) | 80 [80] | | 81.4% |
| 5R-H | 182.012 cd | 5R-H_Min (passed) | 80 [80] | | 127.5% |
| 10R-H | 204.526 cd | 10R-H_Min (passed) | 40 [40] | | 411.3% |
| 20L-5D | 27.2938 cd | 20L-5D_Min (passed) | 10 [10] | | 172.9% |
| 10L-5D | 71.4829 cd | 10L-5D_Min (passed) | 30 [30] | | 138.3% |
| V-5D | 137.112 cd | V-5D_Min (passed) | 70 [70] | | 95.9% |
| 10R-5D | 189.519 cd | 10R-5D_Min (passed) | 30 [30] | | 531.7% |
| 20R-5D | 173.105 cd | 20R-5D_Min (passed) | 10 [10] | | 1631.0% |
| 5L-10D | 87.6356 cd | 5L-10D_Min (passed) | 16 [16] | | 447.7% |
| 5R-10D | 141.374 cd | 5R-10D_Min (passed) | 16 [16] | | 783.6% |

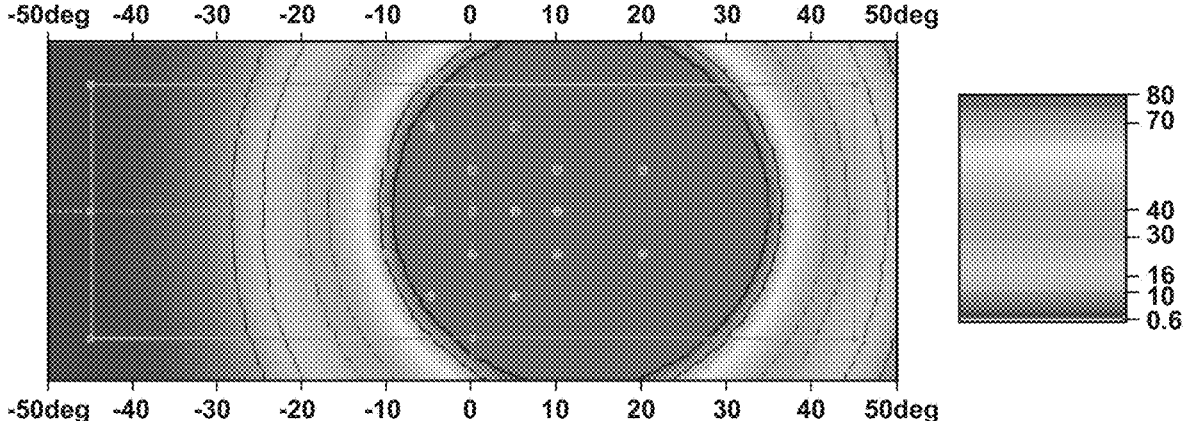

FIG. 6E

<span style="float:right">6004</span>

7000

7003

7002

7000

7003

7002

FLEXIBLE LED DISPLAY HAVING AN OPTIC OPTICALLY COUPLED WITH AN LED CHIP

CROSS-REFERENCE TO RELATED APPLICATION

This application claims the benefit of priority to U.S. Provisional Patent Application No. 63/235,134, entitled "FLEXIBLE LED DISPLAY", filed on Aug. 19, 2021, the disclosure of which is hereby incorporated by reference herein in its entirety for all purposes.

FIELD

The present disclosure relates to light-emitting diodes (LEDs) and a method of fabricating the same, and more particularly, to flexible LED displays.

BACKGROUND

LEDs can offer long operating life (50,000 to 100,000 hours as compared to 500-1500 hours for incandescent filaments) and cost reductions on vertical flip-chip LED devices have enabled the application of such devices to a wider range of operating conditions tailored to automotive, mobility, and military environments.

Over the operating life of a vehicle (e.g., 10-20 years), inorganic LEDs can offer a solution for producing reliable high luminance (candela/m$^2$) white light through blue chip pumped phosphors. For example, low-cost 5630 and 3030 packaged LEDs in general lighting have dominated as cost reduction further allows the adoption of solid-state lighting technology in the marketplace—now approaching 72% in 2021.

However, artistic animation features have not been combined with the regulatory safety lighting to provide messaging and communication to other vehicles, bystanders, and other mobile participants in the transportation system in which semi-autonomy and fully autonomous vehicles participate.

BRIEF DESCRIPTION

Aspects and advantages of the technology will be set forth in part in the following description, or may be obvious from the description, or may be learned through practice of the technology.

In some aspects, the present subject matter is directed to an LED display that includes an LED chip configured to emit light about a focal axis. A circuit board is configured to selectively electrify the LED chip. The circuit board is elastically deformable. An optic optically coupled with the LED chip and defines an optical axis, wherein the optic is elastically deformable, wherein the optical axis and the focal axis maintain a generally aligned position when the circuit board is positioned in a non-planar orientation.

In some aspects, the present subject matter is directed to a method for manufacturing a LED display that includes producing a flexible circuit board substrate. The method also includes forming a dielectric layer on the circuit board substrate. the method further includes disposing one or more traces on the dielectric layer. In addition, the method includes electrically coupling an LED flip chip to the one or more traces. Lastly, the method includes optically coupling an optic with the LED flip chip.

In some aspects, the present subject matter is directed to a vehicle LED display that includes a first LED flip chip configured to emit light about a focal axis and a second LED flip chip positioned adjacently to the first LED flip chip and configured to emit light about a focal axis. A circuit board is configured to selectively electrify the first LED chip and the second LED chip. The circuit board is elastically deformable and defines one or more score lines within an opposing surface from the first LED chip and the second LED chip. A first optic is optically coupled with the first LED chip and defines a first optical axis. The first optic is elastically deformable. The first optical axis and the first focal axis maintain a generally aligned position when the circuit board is positioned in a non-planar orientation. A second optic is optically coupled with the second LED chip and defines a second optical axis. The second optic is elastically deformable. The second optical axis and the second focal axis maintain a generally aligned position when the circuit board is positioned in a non-planar orientation.

These and other features, aspects, and advantages of the present technology will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present technology, including the best mode thereof, directed to one of ordinary skill in the art, is set forth in the specification, which makes reference to the appended figures, in which:

FIG. 4A is a table showing possible thickness measurements of a flexible LED PCB material stack within an LED display in accordance with various aspects of the present disclosure;

FIGS. 6A-6E depict a flexible LED display PCB with primary optics in accordance with various aspects of the present disclosure;

Figure 1:
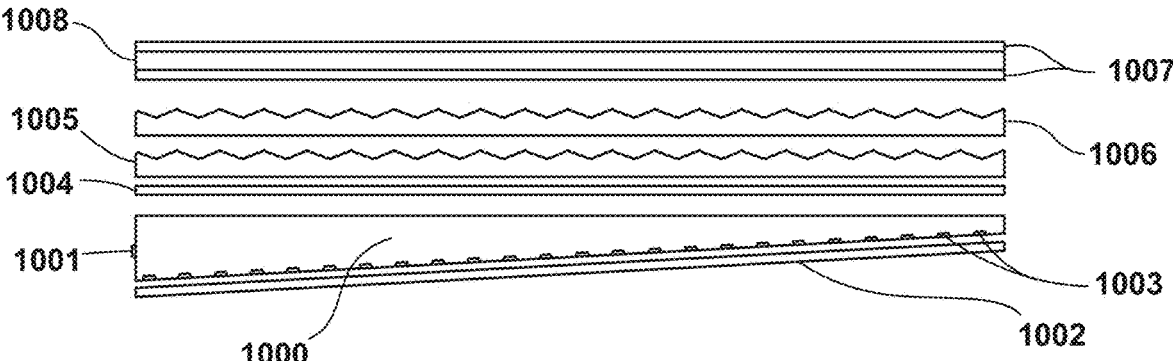
FIG. 1 depicts a conventional LCD in accordance with various aspects of the present disclosure.

Repeat use of reference characters in the present specification and drawings is intended to represent the same or analogous features or elements of the present technology.

DETAILED DESCRIPTION

Reference now will be made in detail to embodiments of the disclosure, one or more examples of which are illustrated in the drawings. Each example is provided by way of explanation of the discourse, not limitation of the disclosure. In fact, it will be apparent to those skilled in the art that various modifications and variations can be made in the present disclosure without departing from the scope or spirit of the disclosure. For instance, features illustrated or described can be used with another embodiment to yield a still further embodiment. Thus, it is intended that the present disclosure covers such modifications and variations as come within the scope of the appended claims and their equivalents.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

As used herein, the terms "first," "second," and "third" may be used interchangeably to distinguish one component from another and are not intended to signify a location or importance of the individual components. The terms "coupled," "fixed," "attached to," and the like refer to both direct coupling, fixing, or attaching, as well as indirect coupling, fixing, or attaching through one or more intermediate components or features, unless otherwise specified herein. The term "selectively" refers to a component's ability to operate in various states (e.g., an ON state and an OFF state) based on manual and/or automatic control of the component.

As used herein, an "x-direction" corresponds to a length (e.g., a long dimension) of a LED chip, a "y-direction" corresponds to a width of a LED chip, and a z-direction corresponds to a vertical distance from a LED chip. In addition, "pitch" corresponds to a chip-to-chip distance between two LED chips in one of their x-direction and their y-direction.

Furthermore, any arrangement of components to achieve the same functionality is effectively "associated" such that the functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality, and any two components capable of being so associated can also be viewed as being "operably couplable" to each other to achieve the desired functionality. Some examples of operably couplable include, but are not limited to, physically mateable, physically interacting components, wirelessly interactable, wirelessly interacting components, logically interacting, and/or logically interactable components.

The singular forms "a," "an," and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms, such as "about," "approximately," "generally," and "substantially," is not to be limited to the precise value specified. In at least some instances, the approximating language may correspond to the precision of an instrument for measuring the value, or the precision of the methods or apparatus for constructing or manufacturing the components and/or systems. For example, the approximating language may refer to being within a ten percent margin.

Moreover, the technology of the present application will be described in relation to exemplary embodiments. The word "exemplary" is used herein to mean "serving as an example, instance, or illustration." Any embodiment described herein as "exemplary" is not necessarily to be construed as preferred or advantageous over other embodiments. Additionally, unless specifically identified otherwise, all embodiments described herein should be considered exemplary.

As used herein, the term "and/or," when used in a list of two or more items, means that any one of the listed items can be employed by itself, or any combination of two or more of the listed items can be employed. For example, if a composition or assembly is described as containing components A, B, and/or C, the composition or assembly can contain A alone; B alone; C alone; A and B in combination; A and C in combination; B and C in combination; or A, B, and C in combination.

FIG. 1 depicts a design in which liquid crystal displays ("LCDs") can form fluid graphics by means of frame sequencing to produce motion produced by means of liquid crystal light modulators.

According to this design, the light production by means of an array of LEDs 1001 injecting light from the side into a tapered light guide 1000 must be ejected from a light source up through a light modulator section by means of many optical devices, such as reflector dot bumps or scatter dots 1003, which are modulated in density and non-linear patterns to produce uniform light up through the top of the display by means of light redirection and recycling through a reflector 1002. In some cases, however, the light which emerges has striations and hot spots which may be diffused to produce a pleasing uniform sheet of light by means of diffusers 1004, and two layers of brightness enhancement films (BEF) 1005 and 1006, which help to extract light from the light guide by means of micro-prisms. The devices or BEF films 1005 and 1006 also provide homogenization before passing through polarizers 1007 and LCD 1008 which is comprised of a TFT electrode array, liquid crystal, glass, and color filters before passing through a protective film or glass sheet to air.

The light display can have high resolution, such as HD 1080 p, but can suffer from poor contrast of less than 300:1, which washes out in full direct sunlight leading to the use of shades and covers to view the graphics displayed. The optical efficiency may also be poor at less than 10%, which makes the application for taillights and display on the exterior of a vehicle difficult.

Figure 2A:
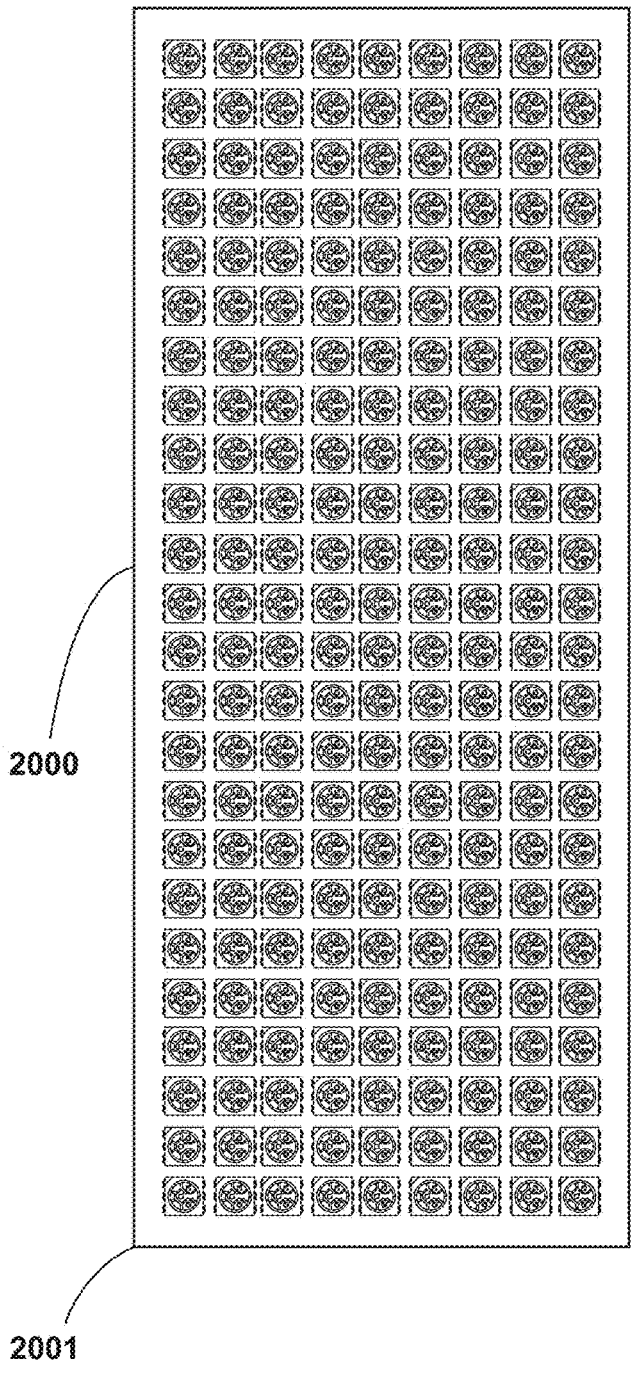
FIGS. 2A-2B depict an LED display on rigid board in accordance with various aspects of the present disclosure.
Figure 2A:
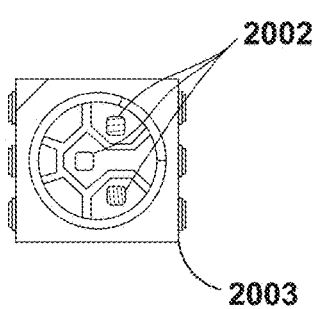

FIG. 2 depicts an LED display 2000 comprised of red, green, and blue (RGB) chips 2002 arranged in package 2003 on a PCB 2001. In some examples, the RGB chips 2002 arranged in the package 2003 may have a dimension of 3 millimeters (mm)×3 mm and arranged on the PCB 2001 at a defined pitch, which may be 4 mm×4 mm.

The PCB 2001 electrifies the LED chips with 3 colors/ package to produce mixed colors. In some instances, the LED display 200 may have an enhanced optical efficiency as the LED display 200 is self-lit leading to no need for additional light modulation sheets as the LED emitters themselves produce the modulated intensity of light. In some examples, the LED display 2000 can be very bright with a brightness of greater than or equal to 1000 nits and a light efficiency of greater than or equal to 70% in various examples.

One problem with the 3030 LED displays is limited resolution as shown 10×25 pixels or 250 pixels, which produces coarse graphics and difficulty for discerning, for example, pictograms, lettering, or numerals required for messaging. Another problem with this LED display is that it is rigid, not flexible, and therefore cannot be contoured to a free-form surface, e.g., such as the taillight shown in FIGS. 5A-5G.

Figures 2B, 3A:
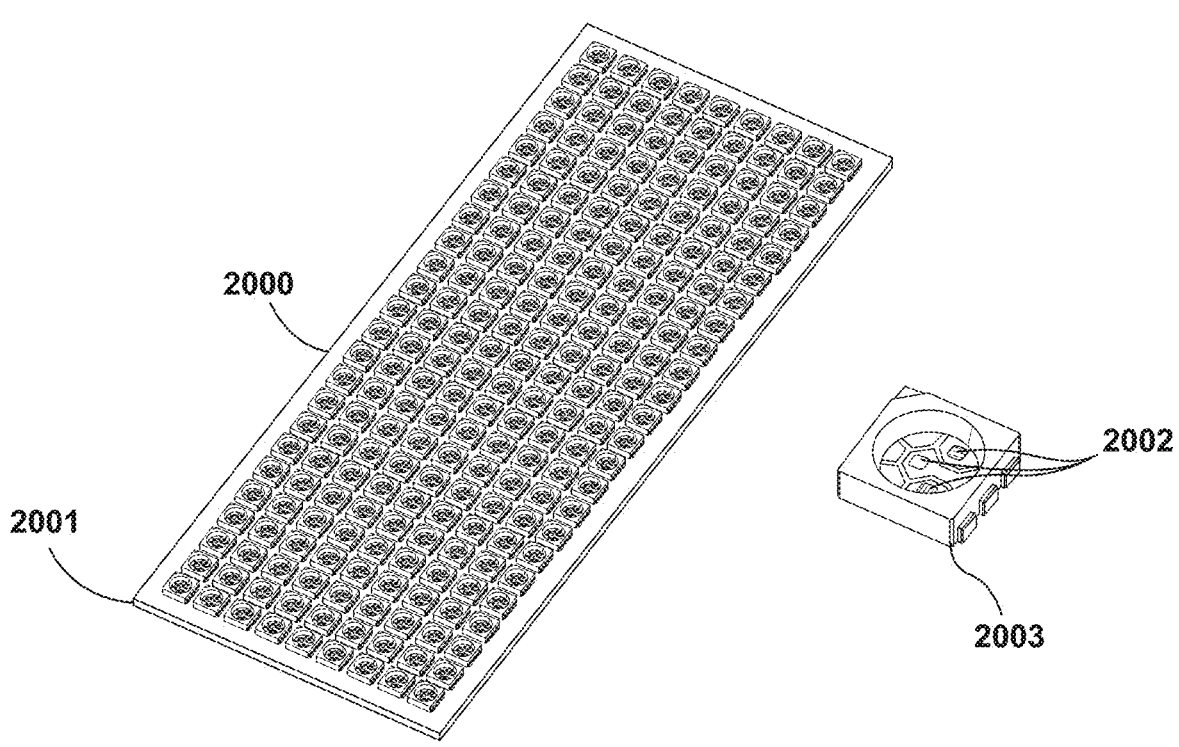
FIG. 3A is a table showing possible thickness measurements of a flexible LED PCB material stack on a low CTE metal within an LED display in accordance with various aspects of the present disclosure.
Figure 3B:
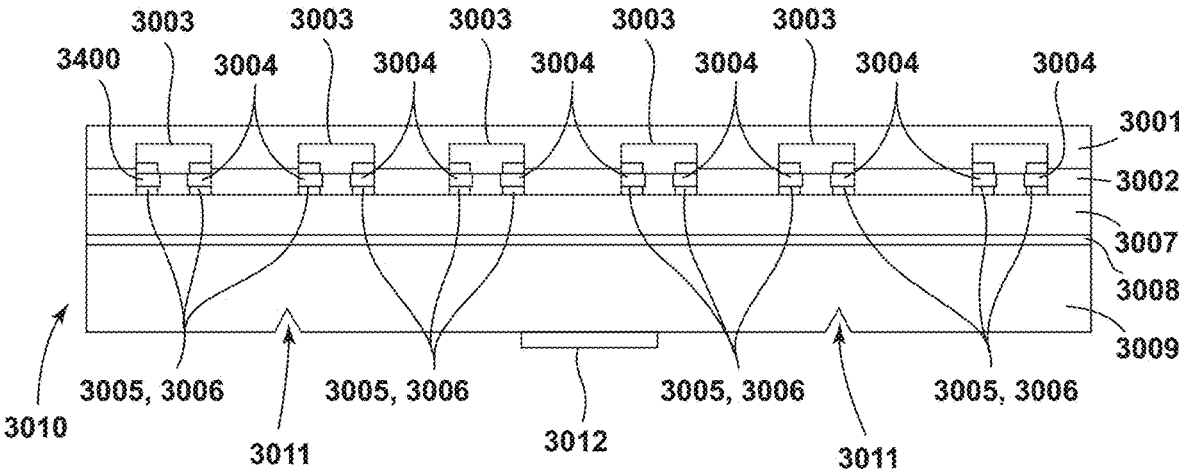
FIG. 3B is a cross-sectional diagram of the LED display in accordance with various aspects of the present disclosure.

Now referring to FIGS. 3A and 3B, a flexible LED display 3000 is illustrated in accordance with various aspects of the present disclosure. As will be described in greater detail below, the flexible LED display 3000 may be capable of curvature in one or more axes and produce graphics in the form of pictograms, lettering, and/or numerals.

As illustrated, the LED display 3000 can include a protection layer 3001 (e.g., silicone) to protect the LED chips 3003 from, for example, contamination, hydrogen sulfide, and moisture as well as to enhance light extraction from the LED chip 3003.

In various examples, the LED display 3000 can further include a circuit board can include a circuit that is configured to electrify or energize the LED chips 3003. The circuit board 3010 may include a substrate 3009 manufactured from a glass-reinforced epoxy laminate material (e.g., FR4), an insulated metal substrate (IMS), in which the metal conductor may not be a pure aluminum, but rather an aluminum-silicon alloy such as aluminum/silicon alloy 4032, which contains up to 22% Silicon and 20% lower CTE ppm/ degrees Celsius, a woven glass fabric surface, and a non-woven core composite comprised of an epoxy synthetic resin (e.g., CEM-1, CEM-2, CEM-3, CEM-4, and/or CEM-5), a crushed glass material, or any other practicable material, which is a thermally conductive dielectric and has high flexural strength fracture resistance that may be greater than 200 MPa and a bending modulus that may be greater than 25 GPa. In some examples, the circuit board may be a thin ceramic-filled and/or glass-filled composite. For example, the circuit board can include embedded ceramic particles, fibers, or ribbons, such as boron nitride, alumina, aluminum nitride, silicon nitride, yttria, or zirconia, which may improve the thermal conductivity of the circuit board. The improved thermal conductivity can allow the LED chips 3003 to operate at lower temperatures thereby improving the performance and efficiency of the flexible LED display 3000.

In various examples, the LED chips 3003 may be soldered directly or indirectly to one or more traces 3007, which may be formed of copper, aluminum, tin, silver, or any other material. In various examples, the traces 3007 may further be plated with electroless nickel 3005 and immersion gold 3006 (ENIG) to enhance the adhesion of a solder 3004 to the traces 3007 and to mitigate against tarnishing in harsh environments.

In some examples, the circuit board may be flexible (e.g., capable of conforming to a non-linear profile without degradation in performance). In such cases, the display may include a polyimide dielectric 3008, which can isolate electrically the circuit from the flexible aluminum PCB substrate 3009. In various examples, the flexible aluminum-silicon PCB substrate 3009 may have a thickness of 0.2 mm to 0.6 mm. Moreover, flexible aluminum-silicon PCB substrate 3009, in addition to being flexible, can also dissipate heat produced by the LED chips 3003. The silicone materials maintain transparency over the high temperature in the visible wavelengths. In addition, circuit interconnects can be designed to dissipate heat in tandem with the PCB substrate 3009 upon which is adhered the polyimide 3008. The polyimide material can further enable flexing of the dielectric without cracking, thereby enabling maintenance of dielectric strength.

In various examples, the LED display 3000 can have a radius of curvature down to a 2 mm radius. In addition, with some v-scoring 3011, the sheets of the circuit board can be conformed in two axes (e.g., X and Y) to produce free-form contours.

In some instances, the individual traces electrify the LED chips 3003 individually at a tight pitch (e.g., as close as approximately 0.2 mm) to enable a higher resolution display capable of illustrating graphics, such as pictograms, text, numerals, and/or any other information with enhanced visibility. Moreover, the LED chips 3003 may each be configured as an LED chip on board (COB). In some examples, the LED COB can be designed to occupy 100-350 μm (e.g., mini chips) and 2-100 μm (e.g., microchips). In addition, configurations of micro LED chips with a size of less than 50 μm may have a sapphire or Si substrate removed, such as by UV excimer or via grinding etch, or polishing may be utilized. In some instances, by using an LED chip on board versus a standard 3030 or 3.0×3.0 mm package, the space savings of each LED chip on the circuit board 86 can be over 99% when compared to a standard 3030 or 3.0×3.0 mm package. In some examples, the LED chip 3003 may be an LED flip chip with both a first electrode and a second electrode positioned on a common side of the LED chip 3003 on a surface facing away from the light extraction surface. As such, the LED chips 3003 may be bonded to the traces.

Additionally or alternatively, in various examples, the LED chip 3003 may include an array of LEDs that are configured to emit varied colors of light for an RGBW (red, green, blue, and white) LED chip, an RGB LED chip, a white LED chip and/or any other assortment of LEDs. In addition, in some cases, each LED chip 3003 can include an internal LED driver for controlling light output from the respective LED chip. Alternatively, in some cases, a controller 3012 may be configured as a driver of one or more of the LED chips 3003 with the controller 3012 being remote from the LED chip 3003. The direct emission capability of the display can enable high efficiency or greater than or equal to 90%. In addition, the display can achieve 16-bit greyscale dimming for smooth transitions and fluid graphics. Moreover, the display can have a high contrast, which may be greater than or equal to 1,000:1. In various instances, the brightness of the display can approach a brightness of greater than or equal to 8,000 nits cd/m² in Red 625 nm, or 30,000 nits cd/m² in white D55, which can enable the display to be utilized in exterior lighting, signaling, and messaging environments.

Figure 5A:
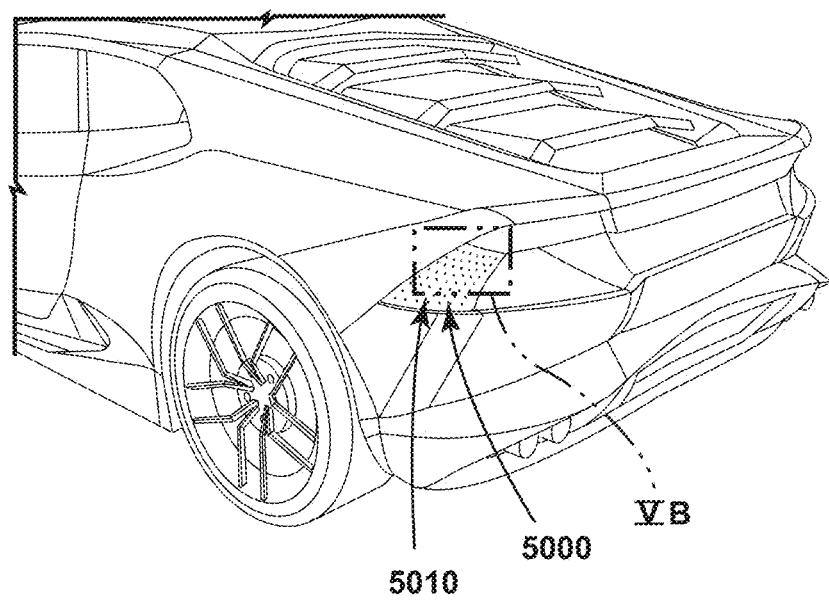
FIGS. 5A-5G depict a conformal LED displays as rear taillight PCB in accordance with various aspects of the present disclosure.
Figure 5B:
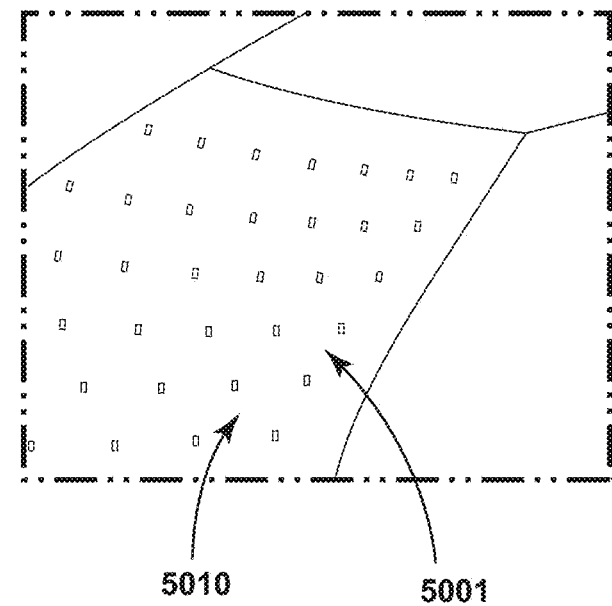
Figure 5C:
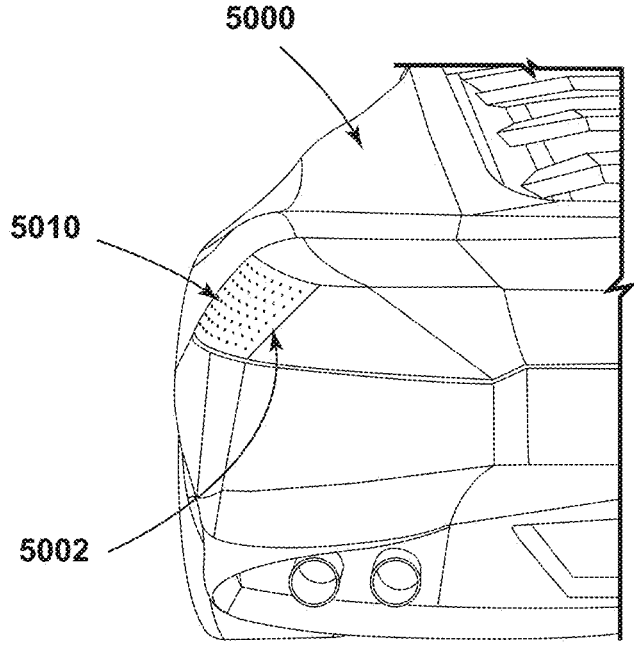

With further reference to FIGS. 3A and 3B, the controller 3012 may be configured as any suitable processor-based device known in the art, such as a computing device or any suitable combination of computing devices. Thus, in several embodiments, the controller 3012 may include one or more processor(s) and associated memory device(s) configured to perform a variety of computer-implemented functions. It will be appreciated that, in several embodiments, the controller 3012 may correspond to an existing controller of a vehicle 500 (FIG. 5A) or the controller 3012 may correspond to a separate processing device. For instance, in some embodiments, the controller 3012 may be implemented within the LED display 3000 to allow for the disclosed LED display 3000 to be implemented without requiring additional software to be uploaded onto existing control devices of the vehicle 500 (FIG. 5A). In examples in which the controller 3012 is operably coupled with the PCB substrate 3009, the controller 3012 may be mounted in a manner that allows for the circuit board to be capable of conforming to a non-linear profile without degradation in performance of the controller 3012.

Figure 4B:
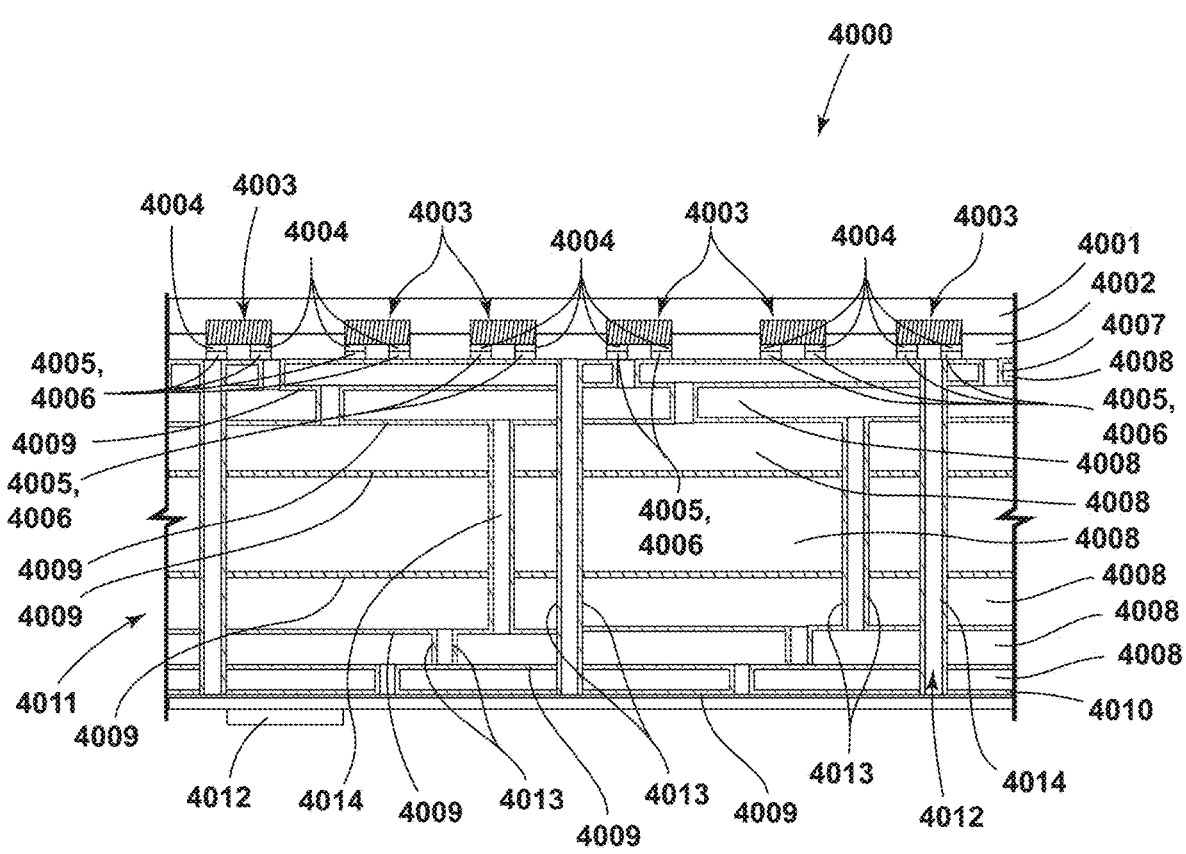
FIG. 4B is a cross-sectional diagram of the LED display in accordance with various aspects of the present disclosure.

Referring now to FIGS. 4A and 4B, the LED display 4000 can include a layer of silicone 4001 to protect components of the LED display 4000, a solder mask 4002 to isolate and protect the circuit, LED chips 4003, adhered directly or indirectly to the PCB 4011 through solder 4004, which adheres to the immersion gold plating 4005 applied to electroless nickel upon the top surface of the traces 4007 (e.g., Cu interconnects). In some instances, the traces 4007 can be of a thickness of ⅓ oz Cu to 1 oz Cu depending on the pad gap for electrifying the LED chips 4003 and the thermal dissipation desired.

In the examples illustrated in FIGS. 4A and 4B, a PCB substrate 4008 may be made of a resilient material that enables flexibility and dielectric isolation, such as a ceramic filled fr4 or CEM3 material in which the fillers are arranged as ceramic fibers or ribbons. In various examples, the resilient material can be produced, for example, by embedding ceramic particles, such as boron nitride, alumina, silicon nitride, yttria, or zirconia into a dielectric medium of the CEM3 material. In such cases, the thermal conductivity can be improved from about 0.3 degrees Celsius/Watt for standard materials to up to about 1.5 degrees C./Watt. This can allow the LED chips 4003 to operate at lower temperatures thereby improving performance and efficiency. In various examples, the thickness of the dielectric 4008 can be as thin as 40 μm up to 1.6 mm, and in some instances, between 0.1 to 0.2 mm for flexibility that allows for LED display curvature flexing as the flexing is at least partially dependent on thickness. For example, a ceramic fiber-filled composite having a 0.2 mm thickness can bend to a 30 mm radius of curvature, and a ceramic fiber-filled composite having a 0.4 mm thickness can bend to a 165 mm radius of curvature before fracturing. In some instances, a radius of bend curvature between 20 and 40 mm will satisfy many free-form surfaces for which the LED display 4000 may be attached.

The flexibility of the materials and a low CTE or coefficient of thermal expansion may be useful for maintaining the reliability of the solder joints of the PCB 4011 over temperature cycling extremes. For example, when compared to 500 cycles for a pure aluminum 1090 with a CTE of 23.6 ppm/degrees Celsius, an aluminum/silicon alloy with a CTE of 19 ppm/degrees Celsius can survive an increased number of thermal shock cycles from −40 degrees Celsius to +125 degrees Celsius for 2,000 cycles without failures or cracks in solder joints, which can impact the brightness of the LED display pixels.

In some examples, the PCB 4011 can include one or more conductive layers 4009 of a heat dissipation material 4009, such as Cu. Additionally or alternatively, the PCB 4011 may include one or more substrate layers 4008. In various examples, one or more thermal vias, which may be constructed of Cu, may be defined by the conductive layers 4009 and/or the substrate layers 4008 to dissipate heat from the traces 4007 therethrough. For example, as illustrated in FIG. 4B, the substrate may include eight conductive layers 4009 (or any other number of conductive layers 4009) that are separated by seven respective substrate layers 4008 layers. In some cases, each of the substrate layers 4008 may be of a common thickness. Alternatively, at least one dielectric layer may have a thickness that is varied from at least one other dielectric layer.

As shown in FIG. 4B, the thermal vias may be formed by one or more holes defined by the various conductive layers 4009 and/or substrate layers 4008 to dissipate heat from the LED display 4000. As illustrated, the thermal vias may include an interconnect that may be formed from any practicable material, such as copper (Cu). Moreover, a filler material may be positioned adjacent to the interconnect, the conductive layers 4009, and/or the substrate layers 4008. For example, the filler material may be an epoxy material, and/or any other practicable material. As provided herein, the thermal vias allow additional heat transfer by providing a reduction in thermal resistance. The number and position of thermal vias have an impact on thermal resistance.

In some cases, a solder mask 4010 can protect the heat dissipation material 4009 (e.g., Cu) on the back side of the circuit.

FIGS. 5A-5G depict various embodiments of the application of a flexible LED display 5010 to the rear taillight of a vehicle 5000 in accordance with various aspects of the present disclosure. As shown, the LED display 5010 can be flexed in two axes depending on the orientation of embedded ceramic fibers, the pattern of v-scores, and the thickness of PCB to enable both rearward facing light 5002 as well as side emission light 5006. This is not possible with traditional rigid LED displays 5010 as they may not be able to conform to these shapes while reliably maintaining the electrification of the LED chips 5001 over temperature, vibration, and other environmental stressors generally experienced in transportation environments.

As shown, the LED chips 5001 can adhere to the flexible PCB in patterns that can produce graphics, safety signaling, and pictograms for messaging. In various examples, the pitch of the LED patterning can be as tight as 0.2 mm or less and as large as 4 mm (or larger) depending on the desired resolution and size of the LED chip 5001. In various instances, the LED chips 5001 can be between 2 μm and 500 μm in mini-chip form with flip-chip electrodes, which can adhere directly or indirectly to the LED PCB.

Figure 5D:
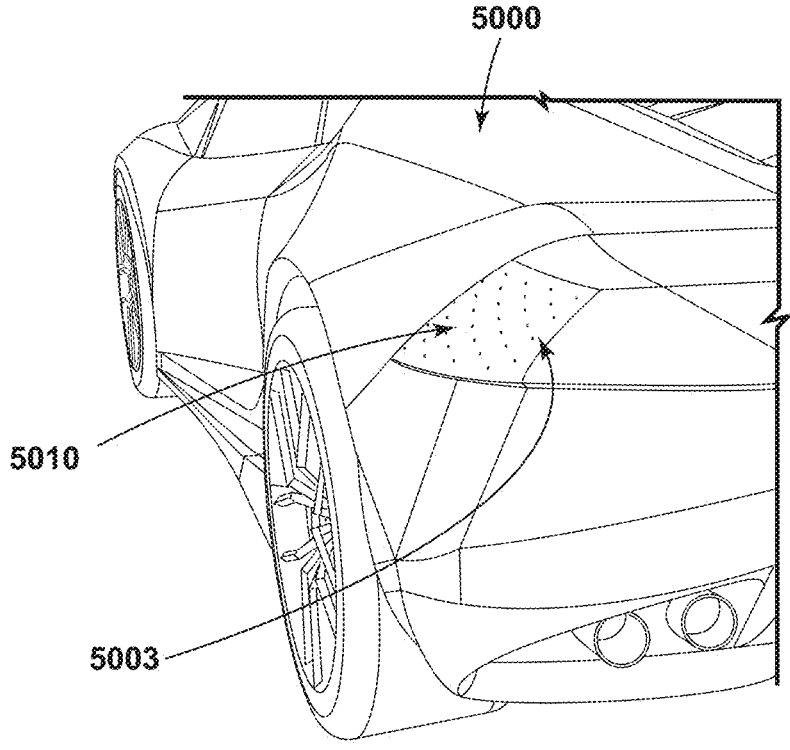

As shown in FIG. 5D, the configuration 5003 of the LED display 5010, for example, can create waves of light propagating from the corner of the LED display 5010 to the lower left corner. These transitions can be programmed with each LED addressable for electric excitation or grouped in zones. As shown with a larger 4.0 mm pitch, the lines or peaks of the waves are visible and distinct, however, at a pitch of 0.2 mm, the display becomes fully contiguous as viewed by the resolution of the human eye which is approximately 60 cycles/deg of a field of view (FOV).

Figure 5E:
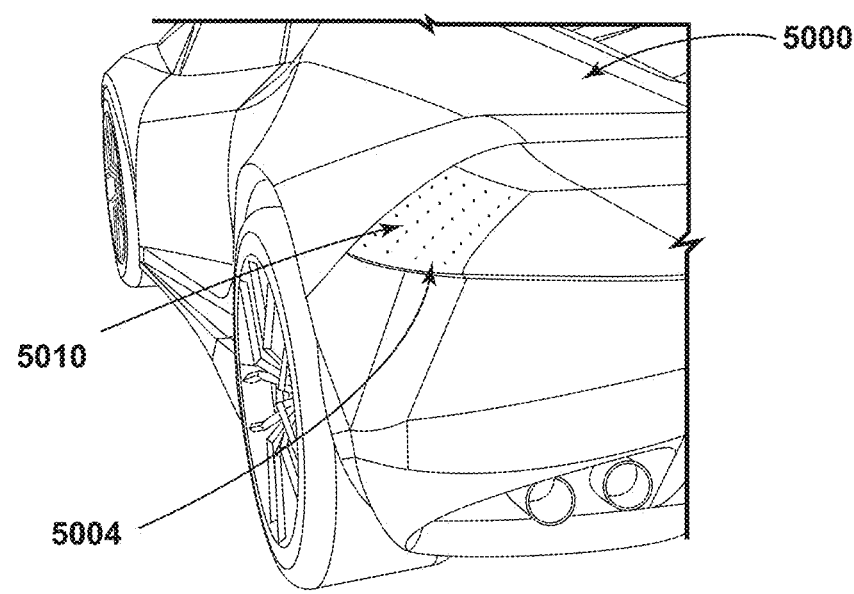

As shown in FIG. 5E, the configuration 5004 of the LED display 5010, for example, can electrify distinct LED chips or pixels 5001 vertically allowing for sweeping transition or turn signal animation representing a change in direction of the vehicle. In various examples, the intensity of the light can be greater than or equal to 80 cd, and colors for signaling can be amber, yellow to orange-red, and deep red at 650 nm.

Figure 5F:
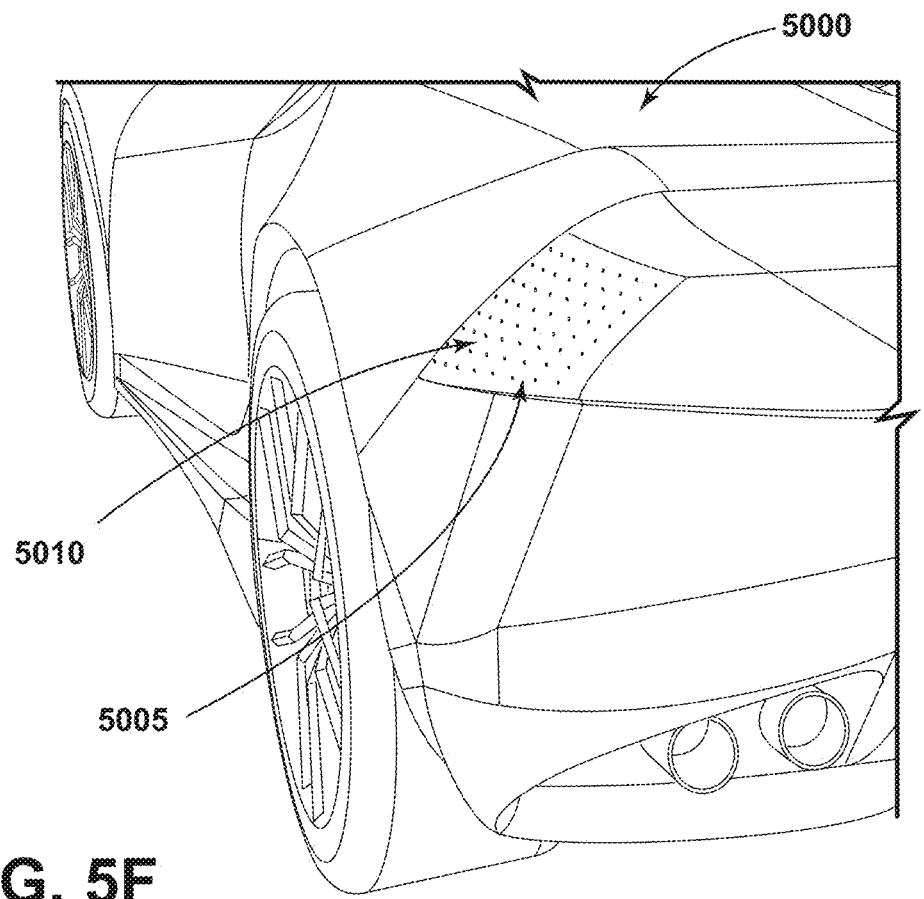

As shown in FIG. 5F, the configuration 5005 of the LED display 5010, for example, can dim the electrified LED chips 5001 to produce a defined position taillight intensity, which may be between 2-20 cd for a low-intensity glow for safety purposes.

Figure 5G:
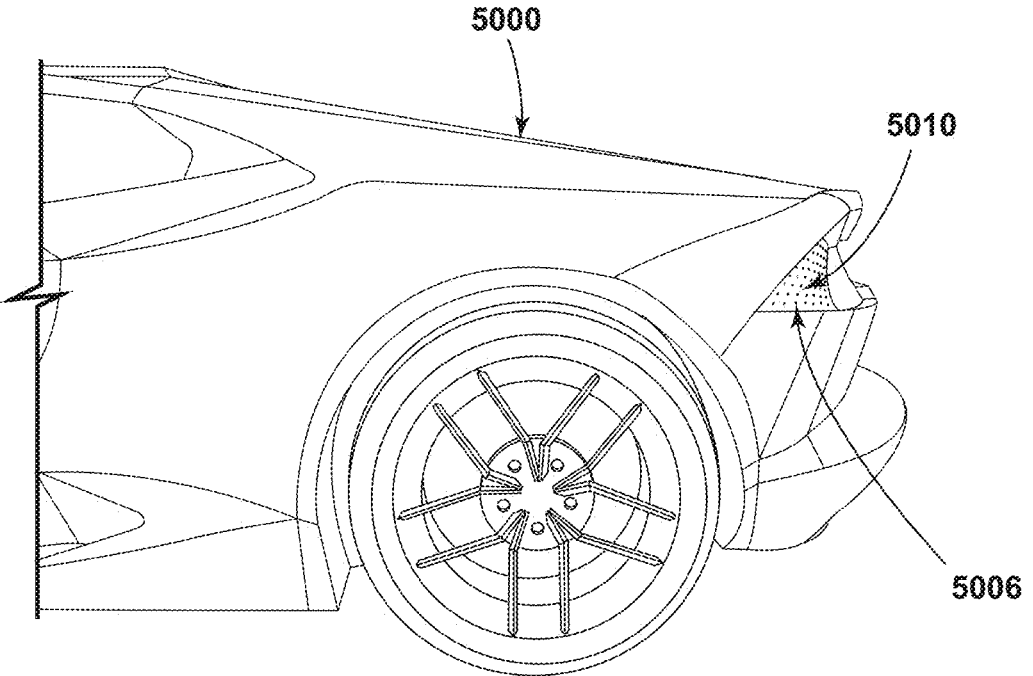

As shown in FIG. 5G, the configuration 5004 of the LED display 5010, for example, can display a free-form pattern that can be seen from many directions around the vehicle including side-view, which is not possible with a rigid PCB. The PCB described herein can be flexed unidirectionally along the long axis or short axis, or in a slight twist as shown in this embodiment.

FIGS. 6A-6E represents a flexible LED display 6000 flexed in one axis in accordance with aspects of the present disclosure. In general, the LED display 6000 can include a PCB 6003 that includes LED chips 6001 applied to the PCB 6003 to produce various light patterns. An LED chip 6001, for example, can produce collimation in a Lambertian pattern with approximately 0.2-0.3 cd/lm. In some cases, mini optics 6002 that are specially tailored to the LED chip's small emission area may be utilized to boost collimation from the LED chip 6001, which may boost the collimation to 2-10 cd/lm thereby enabling more useful light to be directed in a defined direction.

Figure 6A:
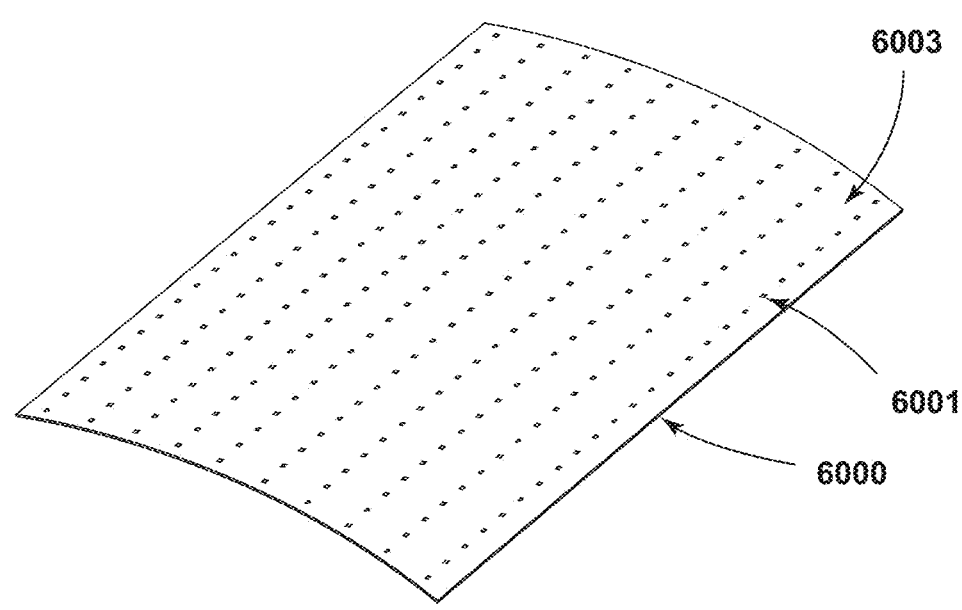
Figure 6B:
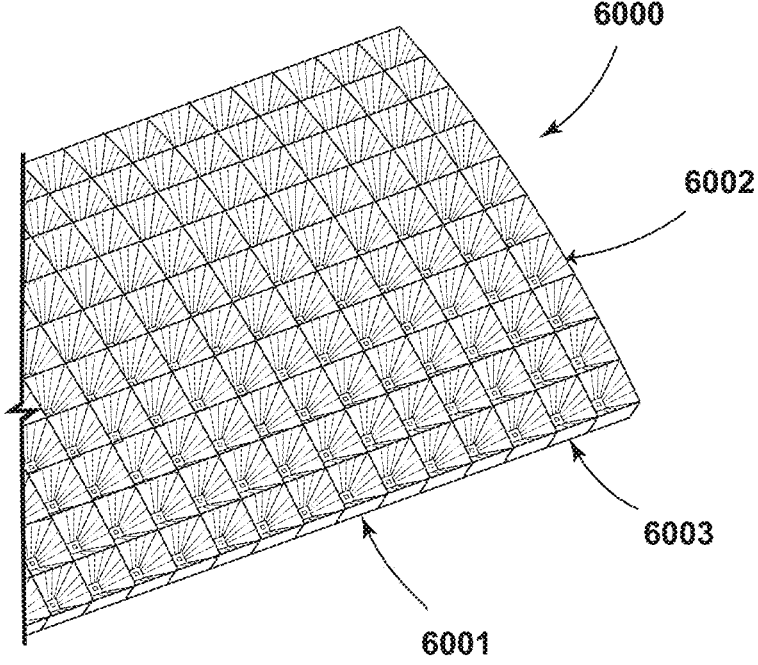
Figure 6C:
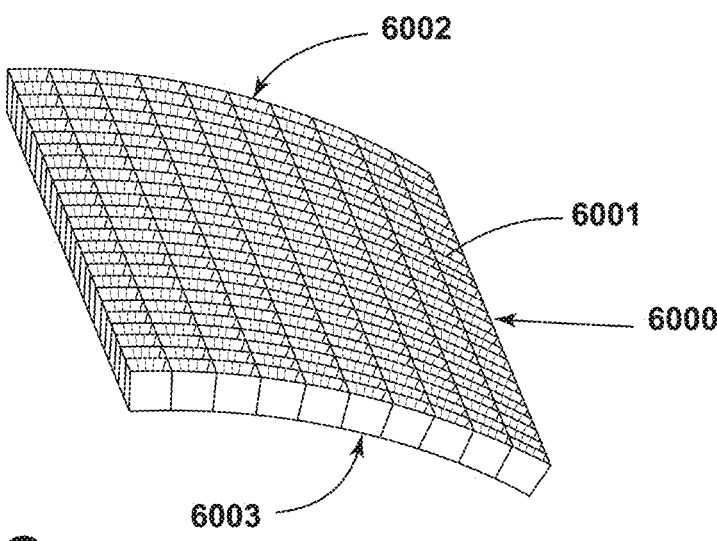
Figure 6D:
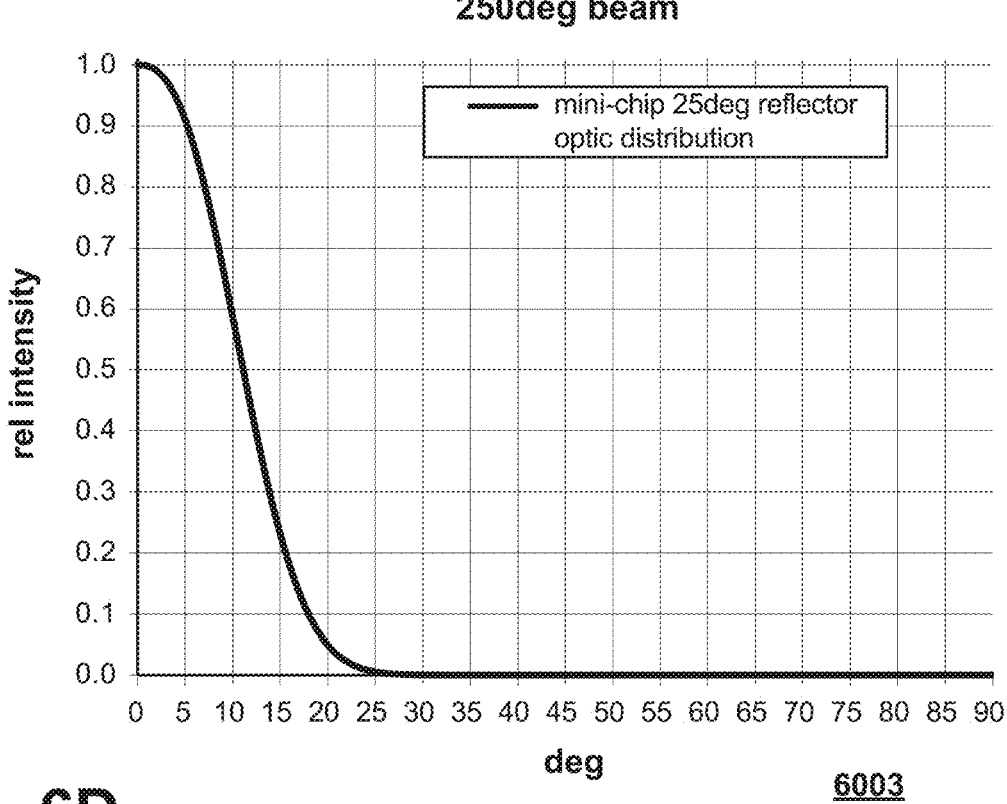

As shown in FIG. 6C, in some examples, the LED display 6000 can have a curvature in one direction, which may be more than, equal to, or greater than 71 mm on a radius. In some instances, the curvature can permit directional light to be guided in a defined direction. The optics 6002 as shown can produce a 25 degrees beam, which can be an improvement over the natural 125 degrees beam of the bare LED chip 6001. In some examples, the optics 6002 can have a low profile (e.g., less than or equal to 4 mm). In addition, the optics 6002 may form light patterns with a tight density, which can enable the combination of both lit uniformity and collimation. Also, hot spots can be reduced to not be noticeable to drivers.

Figure 7A:
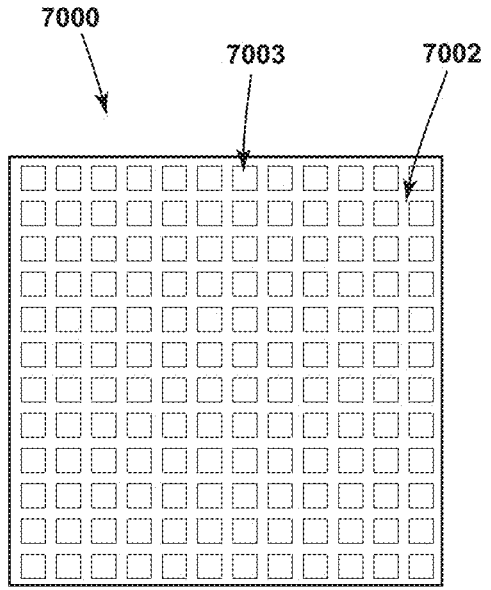
FIG. 7A is a front view of the flexible LED display in an unilluminated state in accordance with various aspects of the present disclosure.
Figure 7B:
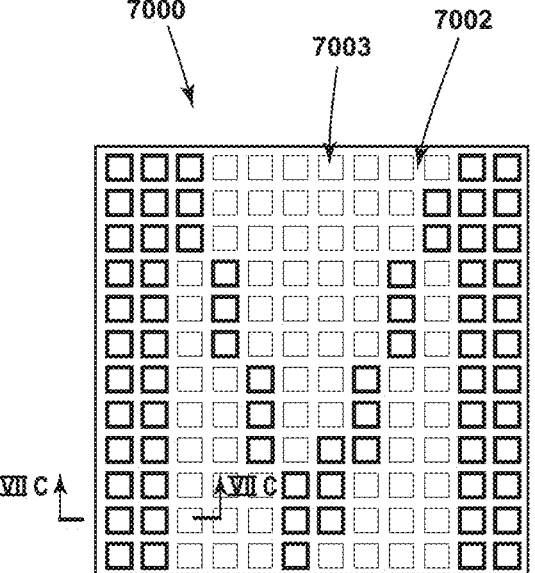
FIG. 7B is a front view of the flexible LED display in a partially illuminated state to form a graphic in accordance with various aspects of the present disclosure.
Figure 7C:
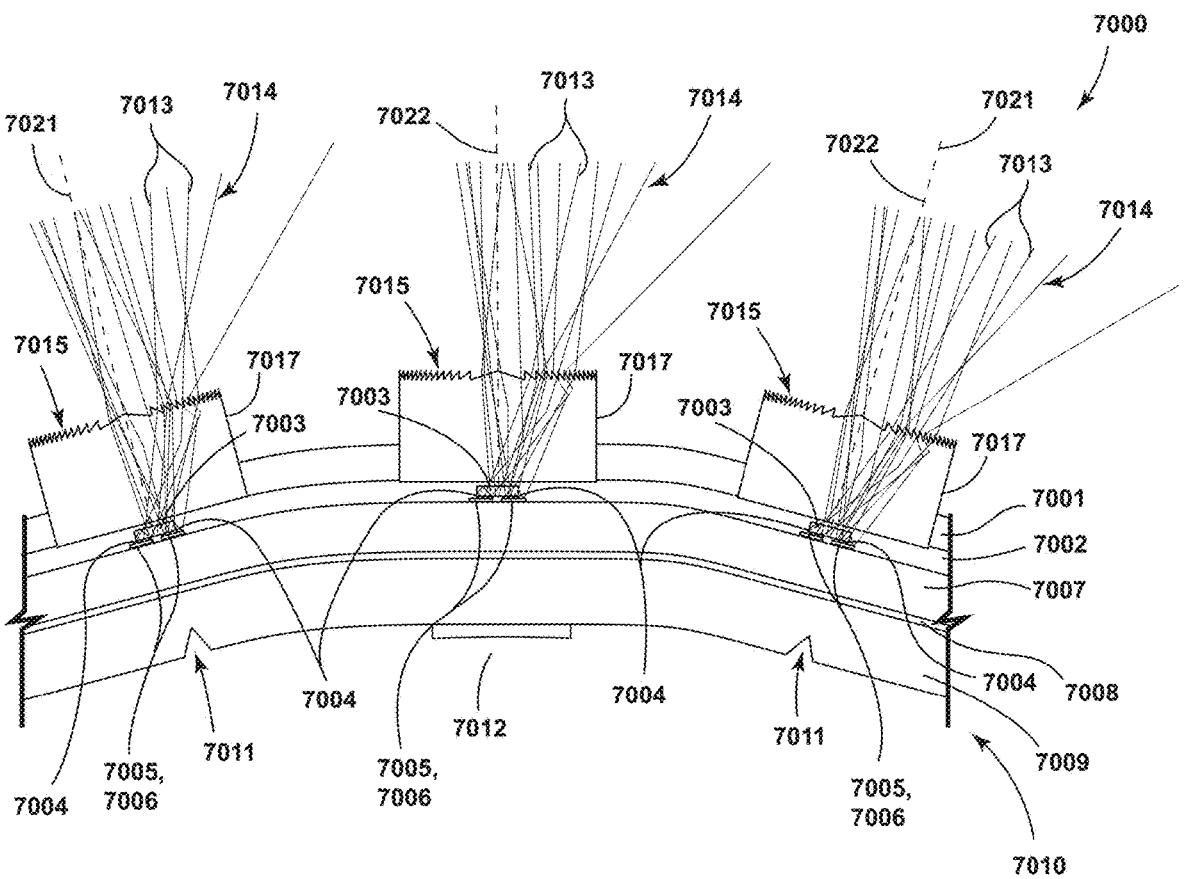
FIG. 7C is a cross-sectional view taken along the line VIIC-VIIC of FIG. 7B.

Referring now to FIGS. 7A-7C, a flexible display 7000 is illustrated in accordance with various aspects of the present disclosure. As illustrated, the LED display 7000 includes an array 7020 of 12×12 LED chips 7003 that may be individually electrified via a programmable controller 7012 to produce free-form graphics, information display (e.g., lettering and figures), and lighting functions. For example, as shown in FIG. 7B, the LED display 7000 may generate various illumination patterns, such as the letter "M" shown.

In some cases, the LED chips 7003 can be transferred to an integrated CMOS backplane to provide both control and electronic driver function. In such cases, a system originally producing 100 Hz placement of light pixels can now be multiples higher (e.g., 10 to 2,500 times greater) as smaller micro-pixel elements bonded to the Si backplane can be placed by high-speed machines. For example, 100 Hz at 100 pixels/tile equals an effective pixel placement rate of 10 kHz at 100 μm LED chip size. At 50 μm LED chip size, 100 Hz with 400 pixels/tile can achieve an effective placement rate of 40 kHz. In various examples, at a LED chip size of 8 μm, 125 pixels/1 mm edge is possible, which can achieve 15,625 pixels/1 mm². When the micro-tiles are placed at 100 Hz, this achieves an effective pixel placement rate of 1.5 MHz.

Referring further to FIG. 7C, a cross section of the LED display 7000 is taken along the line VIIC-VIIC of FIG. 7B. As previously described, the LED display 7000 may include a protection layer 7001, a solder mask 7002, one or more LED chips 7003, and one or more traces 7007, which may be plated with electroless nickel and immersion gold 7006 (ENIG) to enhance the adhesion of solder 3004 to the traces 7007 and to mitigate against tarnishing in harsh environments. Moreover, the LED display 7000 may include a polyimide dielectric 7008, which can isolate electrically the circuit from the flexible PCB substrate 7009.

As shown, light ray paths 7013 emitting from a first LED chip 7003 and a second LED chip 7003 are illustrated from the first LED chip 7003 and the second LED chip 7003 being in an illuminated state while a third LED chip 7003 is in an unilluminated state. As illustrated, the light ray paths 7013 include a central segment ray fan 7014 that passes through an optic 7015 within any redirection from the optic 7015. The light ray paths 7013 also include a lateral segment ray fan 7016 that strikes a redirecting surface 7017 that alters a ray path 7013 of at least a portion of light rays within the lateral segment ray fan 7016. In some instances, the redirecting surface 7017 may be the total internally reflecting (TIR) surface. As illustrated, the protection layer 7001 may be positioned at least partially outwardly of the optic 7015 in a Z-direction.

In various examples, each of the optics 7015 may be formed independently and/or in combination. Moreover, the optics 7015 may be flexible or capable of elastic deformation and formed from a polymerizable compound, a mold in clear (MIC) material, a mold in white (MIW) material, and/or any other material. Such flexible materials can include urethanes, silicone, thermoplastic polyurethane (TPU), or other optical grade flexible materials or combinations of high durometer glass lens materials ShoreD 60 with soft silicone webbing shoreA 40.

In various examples, each LED chip 7003 may be configured to emit light about a focal axis 7021. Additionally or alternatively, the optic 7015 can be optically coupled with the LED chip 7003 and can define an optical axis 7022. In some instances, the optical axis 7022 and the focal axis 7021 maintain a generally aligned position when the circuit board is positioned in a non-planar orientation.

As shown by combining tiles of the LED chips with an optic on a flexible curve the lamp can produce light where required in the intensity zones required for FMVSS 108 qualification. FMVSS 108 refers to Federal Motor Vehicle Safety Standard 108 which pertains to all automotive lighting and signaling devices. The mini-chip optics also reduce light bleed and cross talk and enable pictorial representations, graphics, and text as required for an LED display to produce multiple functions.

Figure 8:
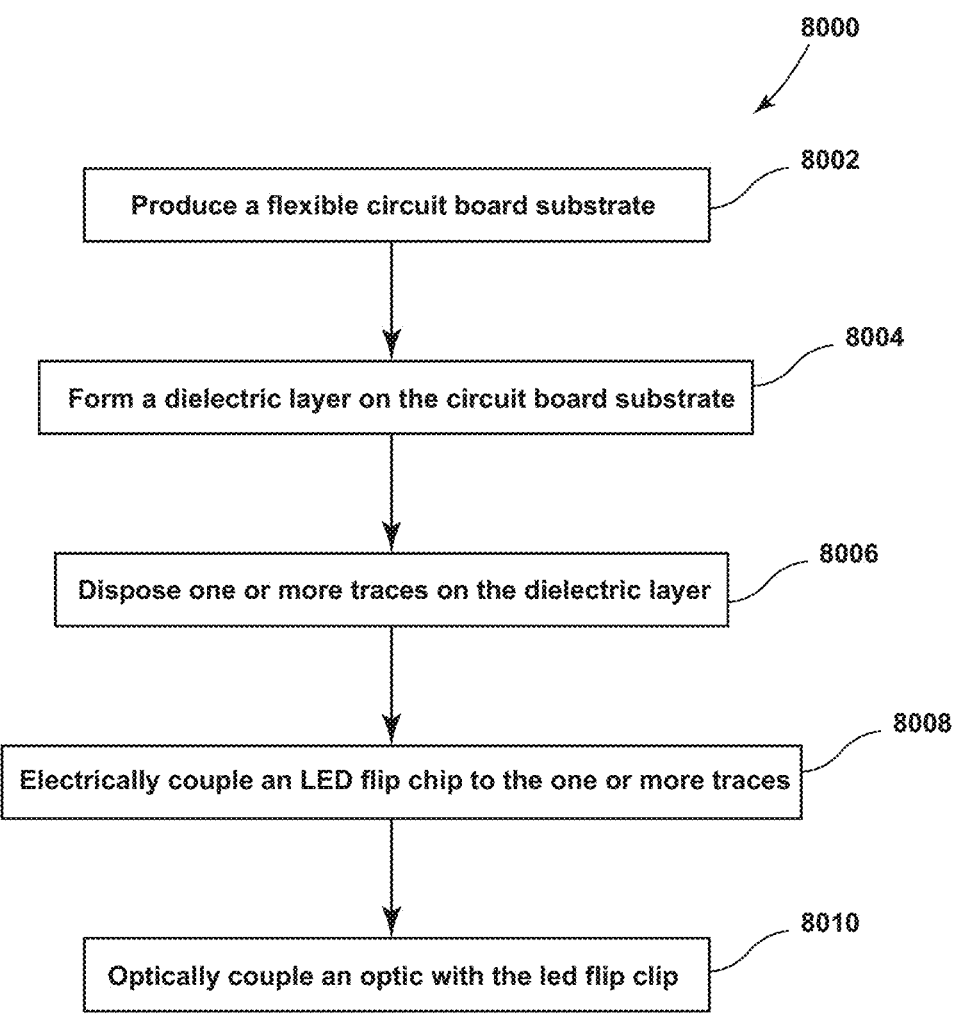
FIG. 8 depicts a method for manufacturing a LED display in accordance with various aspects of the present disclosure.

Now referring to FIGS. 8, a method for manufacturing a wavelength conversion device is provided in accordance with aspects of the present subject matter. In general, the method 8000 will be described herein with reference to the LED display described herein. However, it will be appreciated that the disclosed method 8000 may be implemented with lighting systems having any other suitable configurations. In addition, although FIG. 8 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown in FIG. 13, at (8002), the method 8000 can include producing a flexible circuit board substrate. As provided herein, the substrate can be manufactured from a glass-reinforced epoxy laminate material (e.g., FR4), an insulated metal substrate (IMS), a woven glass fabric surface, and a non-woven glass core combined with epoxy synthetic resin (e.g., CEM-1, CEM-2, CEM-3, CEM-4, and/or CEM-5), a glass material, or any other practicable material. In some instances, producing a flexible circuit board substrate may further include v-scoring one or more surfaces of the substrate to further enhance the flexibility of the substrate.

Additionally, in some cases, producing the flexible circuit board substrate can further include forming a PCB stack of at least two substrate layers with a conductive material positioned therebetween. Additionally or alternatively, producing the flexible circuit board substrate can further include forming one or more thermal vias through the PCB stack. Additionally or alternatively, producing the flexible circuit board substrate can further include positioning an interconnect the at least one of the one or more thermal vias. Additionally or alternatively, producing the flexible circuit board substrate can further include positioning a filler material within the at least one of the one or more thermal vias.

At (8004), the method 8000 can include forming a dielectric layer on the circuit board substrate. In addition, at (8006), the method 8000 can include disposing one or more traces on the dielectric layer.

At (8008), the method 8000 can include electrically coupling an LED flip chip to the one or more traces. In some examples, the LED chip may be an LED flip chip with both a first electrode and a second electrode positioned on a common side of the LED chip on a surface facing away from the light extraction surface. As such, the LED chips may be bonded to the traces. Additionally or alternatively, in various examples, the LED chip may include an array of LEDs that are configured to emit varied colors of light for an RGBW (red, green, blue, and white) LED chip, an RGB LED chip, a white LED chip and/or any other assortment of LEDs.

At (8010), the method 8000 can include optically coupling an optic with the led flip chip. In various examples, each of the optics may be formed independently and/or in combination. Moreover, the optics may be flexible or capable of elastic deformation and formed from a polymerizable compound, a mold in clear (MIC) material, a mold in white (MIW) material, and/or any other material. Such flexible materials can include urethanes, silicone, thermoplastic polyurethane (TPU), or other optical grade flexible materials. In some cases, each LED chip may be configured to emit light about a focal axis. Additionally or alternatively, the optic can be optically coupled with the LED chip and can define an optical axis. In some instances, the optical axis and the focal axis maintain a generally aligned position when the circuit board is positioned in a non-planar orientation.

Applications of embodiments in the present disclosure can be applied in numerous applications and industries. For example, as noted above, the present disclosure could be used in automotive lighting systems. The lighting system may also be implemented in other transportation industries, such as unmanned vehicles, drones, hoverboards, mopeds, bicycles, motorcycles, or other mobile apparatuses. Similarly, the present disclosure may alternatively be implemented in any other illuminable device, such as branding notifications, safety notifications, protocols, and/or messages. For example, storefronts, houses, billboards, or any marketing surface can utilize the lighting system disclosed herein.

The term "software code" or "code" used herein refers to any instructions or set of instructions that influence the operation of a computer or controller. They may exist in a computer-executable form, such as vehicle code, which is the set of instructions and data directly executed by a computer's central processing unit or by a controller, or a human-understandable form, such as source code, which may be compiled to be executed by a computer's central processing unit or by a controller, or an intermediate form, such as object code, which is produced by a compiler. As used herein, the term "software code" or "code" also includes any human-understandable computer instructions or set of instructions, e.g., a script, that may be executed on the fly with the aid of an interpreter executed by a computer's central processing unit or by a controller.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

What is claimed is:

1. A vehicle LED display comprising:
a first LED flip chip configured to emit light about a first focal axis;
a second LED flip chip positioned adjacent to the first LED flip chip and configured to emit light about a second focal axis;
a circuit board configured to selectively electrify the first LED flip chip and the second LED flip chip, wherein the circuit board is elastically deformable and defines one or more score lines within an opposing surface from the first LED flip chip and the second LED flip chip;
a first optic optically coupled with the first LED flip chip and defining a first optical axis, wherein the first optic is elastically deformable, and wherein the first optical axis and the first focal axis maintain a generally aligned position when the circuit board is positioned in a non-planar orientation; and
a second optic optically coupled with the second LED flip chip and defining a second optical axis, wherein the second optic is elastically deformable, and wherein the second optical axis and the second focal axis maintain a generally aligned position when the circuit board is positioned in a non-planar orientation.

2. The vehicle LED display of claim 1, wherein a pitch between the first LED flip chip and the second LED flip chip is less than 1 millimeter (mm).

3. The vehicle LED display of claim 1, wherein the first LED flip chip and the second LED flip chip are configured to generate a contrast ratio of greater than or equal to 10,000:1.

4. The vehicle LED display of claim 1, wherein the first LED flip chip and the second LED flip chip are configured to generate a brightness of the display have a brightness of greater than or equal to 8,000 nits cd/m$^2$.

5. A vehicle LED display comprising:
a first LED chip configured to emit light about a first focal axis;

a circuit board configured to selectively electrify the first LED chip, wherein the circuit board is elastically deformable and defines one or more score lines within a surface thereof;

a first optic optically coupled with the first LED chip and defining a first optical axis, wherein the first optic is elastically deformable, and wherein the first optical axis and the first focal axis maintain a generally aligned position when the circuit board is positioned in a non-planar orientation;

a second LED chip positioned adjacent to the first LED chip and configured to emit light about a second focal axis, wherein the circuit board is further configured to selectively electrify the second LED chip; and a second optic optically coupled with the second LED chip and defining a second optical axis, wherein the second optic is elastically deformable, and wherein the second optical axis and the second focal axis maintain a generally aligned position when the circuit board is positioned in a second non-planar orientation.

6. The vehicle LED display of claim 5, wherein the first LED chip and the second LED chip are configured to generate a contrast ratio of greater than or equal to 10,000:1.

7. The vehicle LED display of claim 5, wherein the first LED chip and the second LED chip are configured to generate a brightness of greater than or equal to 8,000 nits cd/m².

8. A vehicle LED display comprising:

a first LED chip configured to emit light about a first focal axis;

a circuit board configured to selectively electrify the first LED chip;

a first optic optically coupled with the first LED chip and defining a first optical axis, wherein the first optic is elastically deformable, and wherein the first optical axis and the first focal axis maintain a generally aligned position when the circuit board is positioned in a non-planar orientation;

a second LED chip positioned adjacent to the first LED chip and configured to emit light about a second focal axis, wherein the circuit board is further configured to selectively electrify the second LED chip; and a second optic optically coupled with the second LED chip and defining a second optical axis, wherein the second optic is elastically deformable, and wherein the second optical axis and the second focal axis maintain a generally aligned position when the circuit board is positioned in a second non-planar orientation, wherein the first LED chip and the second LED chip are configured to generate a contrast ratio of greater than or equal to 10,000:1.

9. The vehicle LED display of claim 8, wherein the circuit board is elastically deformable and defines one or more score lines within a surface thereof.

10. The vehicle LED display of claim 9, wherein the first LED chip and the second LED chip are configured to generate a brightness of greater than or equal to 8,000 nits cd/m².

* * * * *